United States Patent
Wang et al.

(10) Patent No.: US 11,070,221 B1
(45) Date of Patent: Jul. 20, 2021

(54) ANALOG TO DIGITAL CONVERTER DEVICE AND METHOD FOR CALIBRATING CLOCK SKEW

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hao Wang, Hsinchu (TW); Hsin-Han Han, Hsinchu (TW); Yu-Chu Chen, Hsinchu (TW)

(73) Assignees: GLOBAL UNICHIP CORPORATION, Hsinchu (TW); TAIWAN SEMICONDUCTOR MANUFACTURING CO, LTD., Hsinchu (TW)

( * ) Notice: Subject to any disclaimer, the term of this patent is extended or adjusted under 35 U.S.C. 154(b) by 0 days.

(21) Appl. No.: 17/015,093

(22) Filed: Sep. 9, 2020

(30) Foreign Application Priority Data

Feb. 17, 2020 (TW) .................................. 109105041

(51) Int. Cl.
*H03M 1/10* (2006.01)
*H03M 1/12* (2006.01)

(52) U.S. Cl.
CPC ............ *H03M 1/1009* (2013.01); *H03M 1/10* (2013.01); *H03M 1/12* (2013.01)

(58) Field of Classification Search
CPC ......... H03M 1/1009; H03M 1/12; H03M 1/10
See application file for complete search history.

(56) References Cited

U.S. PATENT DOCUMENTS

| | | | |
|---|---|---|---|
| 8,830,094 B1 | 9/2014 | Erdmann | |
| 10,291,247 B1* | 5/2019 | Verbruggen | ........ H03M 1/0656 |
| 10,483,996 B1* | 11/2019 | Erdmann | .................. G06F 1/10 |
| 10,917,103 B2* | 2/2021 | Kang | .................. H03M 1/1023 |
| 2012/0262318 A1 | 10/2012 | Straayer et al. | |

FOREIGN PATENT DOCUMENTS

| | | |
|---|---|---|
| CN | 103825612 A | 5/2014 |
| TW | I572145 B | 2/2017 |
| TW | I605687 B | 11/2017 |

OTHER PUBLICATIONS

Hegong Wei et al., An 8 Bit 4 GS/s 120 mW CMOS ADC, IEEE Journal of Solid-State Circuits, vol. 49, No. 8, Aug. 2014, p. 1751-1761.

* cited by examiner

*Primary Examiner* — Brian K Young
(74) *Attorney, Agent, or Firm* — CKC & Partners Co., LLC

(57) ABSTRACT

An analog to digital converter (ADC) device includes ADC circuits, a calibration circuit, and a skew adjusting circuit. The ADC circuits convert an input signal according to interleaved clock signals, in order to generate first quantized outputs. The calibration circuit performs at least one calibration computation according to the first quantized outputs to generate second quantized outputs. The skew adjusting circuit determines maximum value signals, to which the second quantized outputs correspond in a predetermined interval, and averages the maximum value signals to generate a reference signal, and compares the reference signal with each of the maximum value signals to generate detecting signals, and determines whether the detecting signals are adjusted or not according to a signal frequency to generate adjusting signals, in order to reduce a clock skew in the ADC circuits.

20 Claims, 8 Drawing Sheets

US 11,070,221 B1

ANALOG TO DIGITAL CONVERTER DEVICE AND METHOD FOR CALIBRATING CLOCK SKEW

The present application claims priority to Taiwan Application Serial Number 109105041, filed Feb. 17, 2020, which is incorporated herein by reference in its entirety.

BACKGROUND

Technical Field

The present disclosure relates to an analog to digital converter device. More particularly, the present disclosure relates to a time-interleaved analog to digital converter device and a clock skew calibration method thereof.

Description of Related Art

Analog-to-digital converter (ADC) has been often applied to a variety of electronic devices, to convert analog signals to digital signals to perform signal processing. In practical applications, the resolution or linearity of ADC will be affected by gain errors, voltage errors or timing errors. For timing errors, the existing technology has to set up complex circuits (such as additional reference ADC circuits, auxiliary ADC circuits) or use off-chip calibration to perform calibration, so that the power consumption or the calibration period of the ADC becomes higher and higher.

SUMMARY

In order to solve the problem mentioned above, one aspect of the present disclosure is to provide an analog to digital converter (ADC) device which includes a number of ADC circuits, a calibration circuit, and a skew adjusting circuit. The ADC circuits are configured to convert an input signal, according to a number of interleaved clock signals, to generate a number of first quantized outputs. The calibration circuit is configured to perform at least one calibration computation, according to the first quantized outputs, to generate a number of second quantized outputs. The skew adjusting circuit is configured to multiply a number of even quantized outputs of the second quantized outputs by a ratio value to generate a number of third quantized outputs, and generate a number of differential signals according to the third quantized outputs and a number of odd quantized outputs of the second quantized outputs, and analyze a time difference information of the interleaved clock signals within a sampling period, according to the differential signals, to generate a number of adjusting signals, in which the adjusting signals are configured to reduce a clock skew in the ADC circuits.

Some aspects of the present disclosure provide an analog to digital converter (ADC) device which includes a number of ADC circuits, a calibration circuit, and a skew adjusting circuit. The ADC circuits are configured to convert an input signal, according to a number of interleaved clock signals, to generate a number of first quantized outputs. The calibration circuit is configured to perform at least one calibration computation, according to the first quantized outputs, to generate a number of second quantized outputs. The skew adjusting circuit is configured to multiply a number of odd quantized outputs of the second quantized outputs by a ratio value to generate a number of third quantized outputs, and generate a number of differential signals according to the third quantized outputs and a number of even quantized outputs of the second quantized outputs, and analyze a time difference information of the interleaved clock signals within a sampling period, according to the differential signals, to generate a number of adjusting signals, in which the adjusting signals are configured to reduce a clock skew in the ADC circuits.

Some aspects of the present disclosure provide a method for calibrating clock skew. At least one calibrating operation is performed, according to a number of first quantized outputs generated by a number of analog to digital converter (ADC) circuits, to generate a number of second quantized outputs. A number of even quantized outputs of the second quantized outputs are multiplied by a ratio value, to generate a number of third quantized outputs, and a number of differential signals are generated according to the third quantized outputs and a number of odd quantized outputs of the second quantized outputs, by a skew adjusting circuit. A time difference information of the interleaved clock signals within a sampling period is analyzed according to the differential signals, to generate a number of adjusting signals. The adjusting signals are configured to reduce a clock skew in the ADC circuits.

Some aspects of the present disclosure provide a method for calibrating clock skew. At least one calibrating operation is performed, according to a number of first quantized outputs generated by a number of analog to digital converter (ADC) circuits, to generate a number of second quantized outputs. A number of odd quantized outputs of the second quantized outputs are multiplied by a ratio value, to generate a number of third quantized outputs, and a number of differential signals are generated according to the third quantized outputs and a number of even quantized outputs of the second quantized outputs, by a skew adjusting circuit. A time difference information of the interleaved clock signals within a sampling period is analyzed according to the differential signals, to generate a number of adjusting signals. The adjusting signals are configured to reduce a clock skew in the ADC circuits.

As described above, the ADC device and the method for calibrating clock skew are mainly aim to generate the frequency-mixed quantized outputs by mixing a part the quantized output by a frequency mixing circuit, and calculate the differential signals. Therefore, the information of the clock skew can be obtained by simple computation, and be calibrated by the ADC device. In this way, the power consumption and the calibration period can be reduced.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
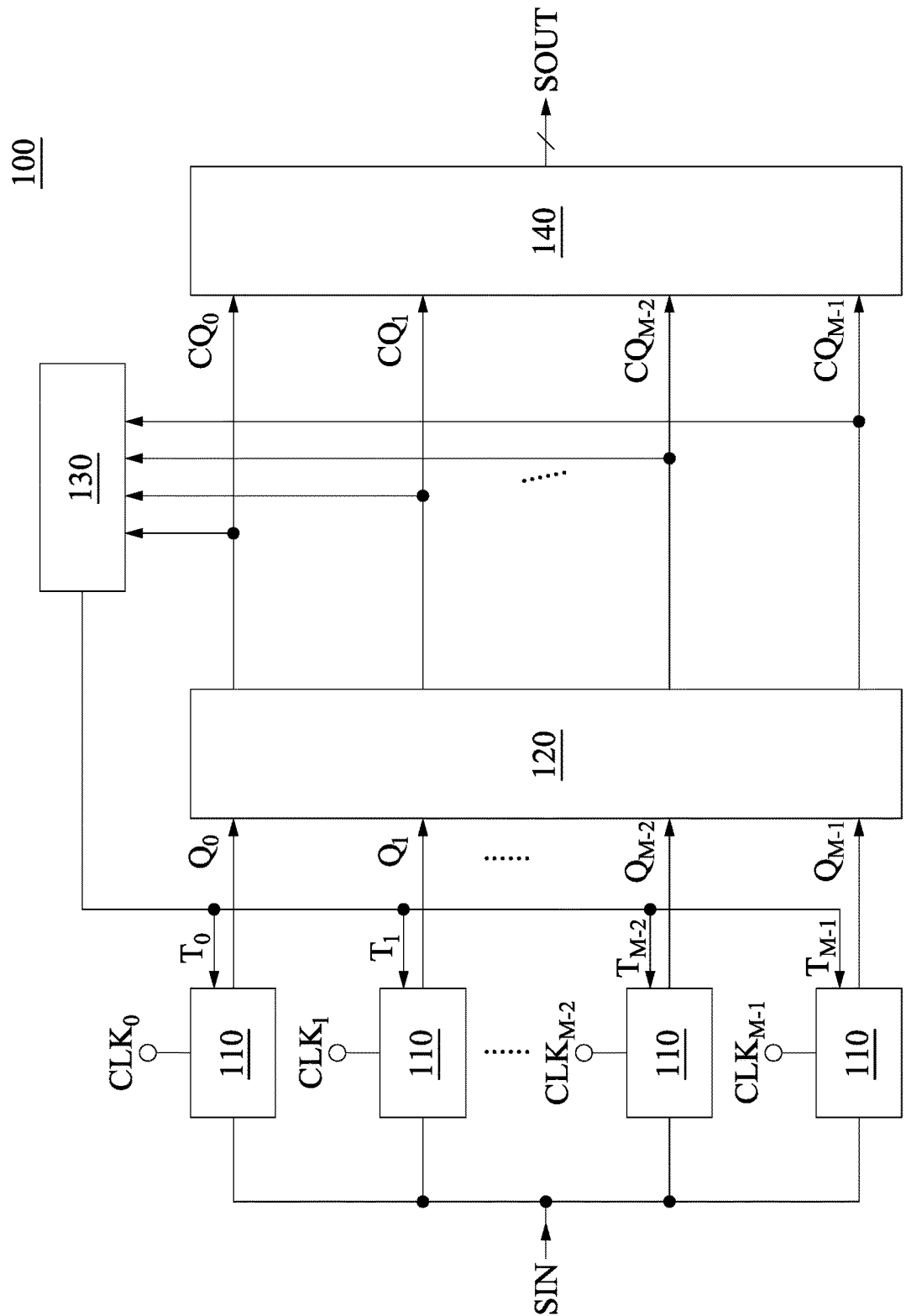
FIG. 1A is a schematic diagram illustrating an analog to digital converter (ADC) device, in accordance with some embodiments of the present disclosure.
Figure 1B:
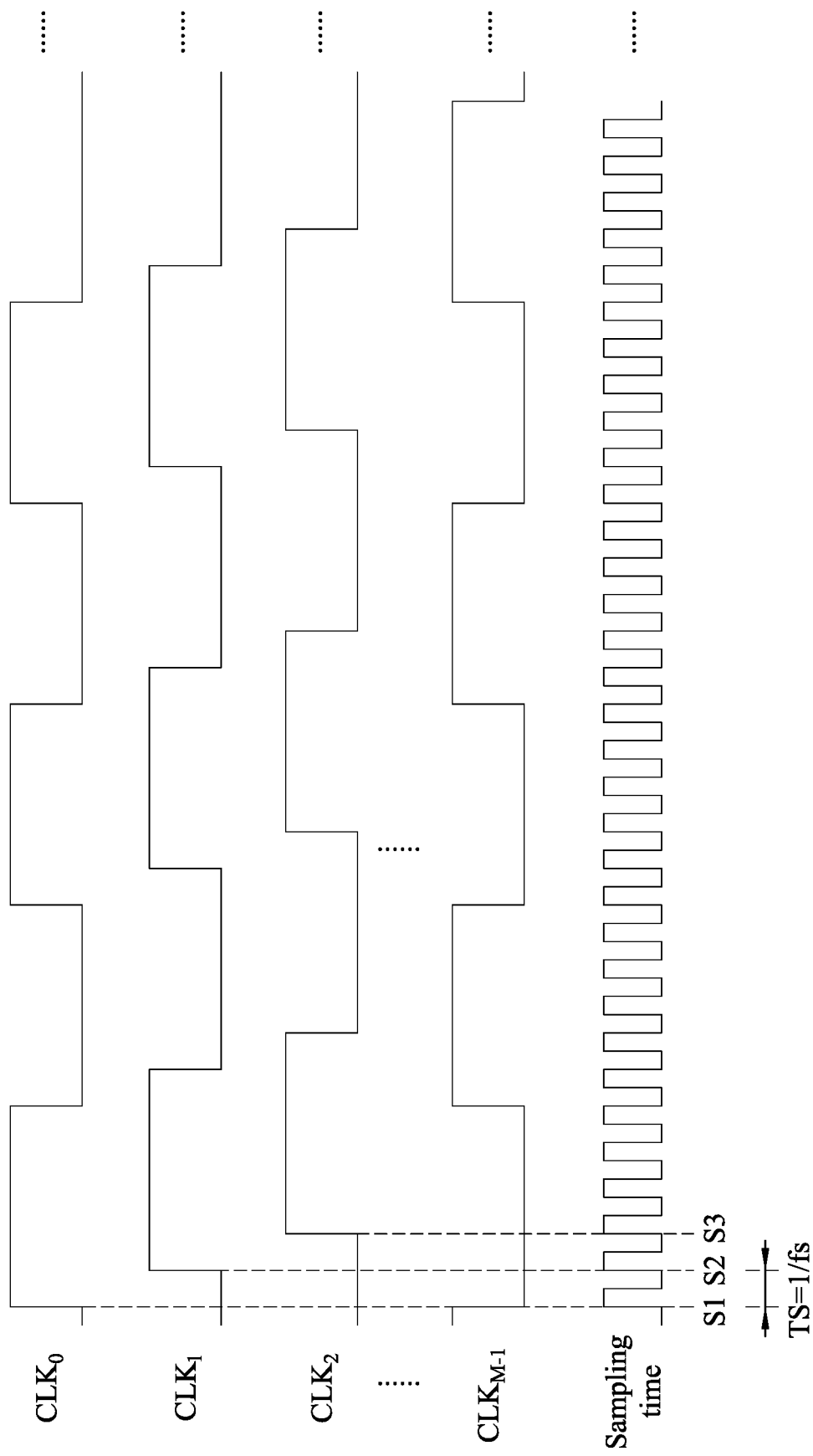
FIG. 1B is a waveform diagram illustrating a number of clock signals in FIG. 1A, in accordance with some embodiments of the present disclosure.

Reference is now made to FIG. 1A and FIG. 1B. FIG. 1A is a schematic diagram illustrating an analog to digital converter (ADC) device 100 in accordance with some embodiments of the present disclosure. FIG. 1B is a waveform diagram illustrating clock signals $CLK_0 \sim CLK_{M-1}$ in FIG. 1A in accordance with some embodiments of the present disclosure. In some embodiments, the ADC device 100 is operated as a multiple channel time-interleaved ADC.

In some embodiments, the ADC device 100 includes a number of ADC circuits 110, a calibration circuit 120, a skew adjusting circuit 130 and an output circuit 140. To be noticed, each of the ADC circuits 110 is operated as a single channel. In other words, in this embodiment, the ADC device 100 includes M channels. In some embodiments, M is an even number. As shown in FIG. 1A, the ADC circuits 110 are configured to perform analog to digital conversion on an input signal SIN according to one of the clock signals $CLK_0 \sim CLK_{M-1}$, to generate the corresponding one of the quantized outputs $Q_0 \sim Q_{M-1}$.

As shown in FIG. 1B, there is a time interval between two adjacent clock signals of the clock signals $CLK_0 \sim CLK_{M-1}$, and therefore, the first channel and the second channel perform sampling and analog to digital conversion at different times. For example, the first channel (i.e., the ADC circuits 110 operated according to the clock signal $CLK_0$) samples the input signal SIN and performs analog to digital conversion at the first sampling time 51, and the second channel (i.e., the ADC circuits 110 operated according to the clock signal $CLK_1$) samples the input signal SIN and performs analog to digital conversion at the second sampling time S2. The difference between the sampling time 51 and the sampling time S2 is sampling period TS (which corresponds to a sampling frequency fs, and TS=1/fs. Accordingly, the M channels can be operated according to a number of interleaving timing).

Following the previous description, the calibration circuit 120 is coupled to each of the ADC circuits 110, to receive a number of quantized outputs $Q_0 \sim Q_{M-1}$. The calibration circuit 120 can perform at least one calibration computation according to the quantized outputs $Q_0 \sim Q_{M-1}$, to calibrate offsets and gain errors in the ADC circuits 110, and generate calibrated quantized outputs $CQ_0 \sim CQ_{M-1}$.

In some embodiments, the calibration circuit 120 can be a foreground calibration circuit or a background calibration circuit. For example, the calibration circuit 120 can include a pseudo random value generator circuit (not shown in figure) and a digital processing circuit (not shown in figure), in which the pseudo random value generator circuit generates a calibration signal to the ADC circuits 110, and the digital processing circuit can perform an adaptation algorithm (i.e., the aforementioned at least one calibration computation) according to the quantized outputs $Q_0 \sim Q_{M-1}$ to reduce offsets or errors of quantized outputs $Q_0 \sim Q_{M-1}$. The aforementioned calibration circuit 120 is only an example, and the present disclosure is not limited thereto. Various types of calibration computations and the calibration circuit 120 are within the scope of the present disclosure.

Following the previous description, the skew adjusting circuit 130 is electrically coupled to the calibration circuit 120, to receive the calibrated quantized outputs $CQ_0 \sim CQ_{M-1}$. In some embodiments, the skew adjusting circuit 130 can analyze the clock skew (equivalent to phase error) between the ADC circuits 110 according to the quantized outputs $CQ_0 \sim CQ_{M-1}$, to generate the adjusting signals $T_0 \sim T_{M-1}$. In some embodiments, the skew adjusting circuit 130 outputs the adjusting signals $T_0 \sim T_{M-1}$ to the ADC circuits 110 respectively, and the adjusting signals $T_0 \sim T_{M-1}$ are configured to indicate the timing of the ADC circuits 110 which should be adjusted because of the clock skew.

In some embodiments, the ADC circuits 110 can adjust the execution timing of the sampling operation and/or the analog to digital conversion operation, according to the adjusting signals $T_0 \sim T_{M-1}$, to equivalently calibrate the clock skew. Or, in some embodiments, the timing of the clock signals $CLK_0 \sim CLK_{M-1}$ can be directly adjusted according to the adjusting signals $T_0 \sim T_{M-1}$, to equivalently reduce clock skew. For example, the adjusting signals $T_0 \sim T_{M-1}$ are inputted to the clock generator, phase interpolator, or a digital delay controller, which are configured to generate the clock signals $CLK_0 \sim CLK_{M-1}$, to adjust the phase of the clock signals $CLK_0 \sim CLK_{M-1}$. Aforementioned configurations of reducing the clock skew according to the adjusting signals $T_0 \sim T_{M-1}$ mentioned above are described for example, and the present disclosure is not limited thereto.

Following the previous description, the output circuit 140 is electrically coupled to the calibration circuit 120, to receive the calibrated quantized outputs $CQ_0 \sim CQ_{M-1}$. The output circuit 140 performs data combination operation according to the calibrated quantized outputs $CQ_0 \sim CQ_{M-1}$, to generate the digital signal SOUT. By operation of data combination, the quantized outputs $CQ_0 \sim CQ_{M-1}$ provided by the M channels can be combined as a single digital signal SOUT with a sampling frequency fs, in which the sampling frequency fs is M times of the clock signal frequency. In some embodiments, the output circuit 140 can be implemented by a multiplexer circuit, but the present disclosure is not limited thereto.

Figure 2:
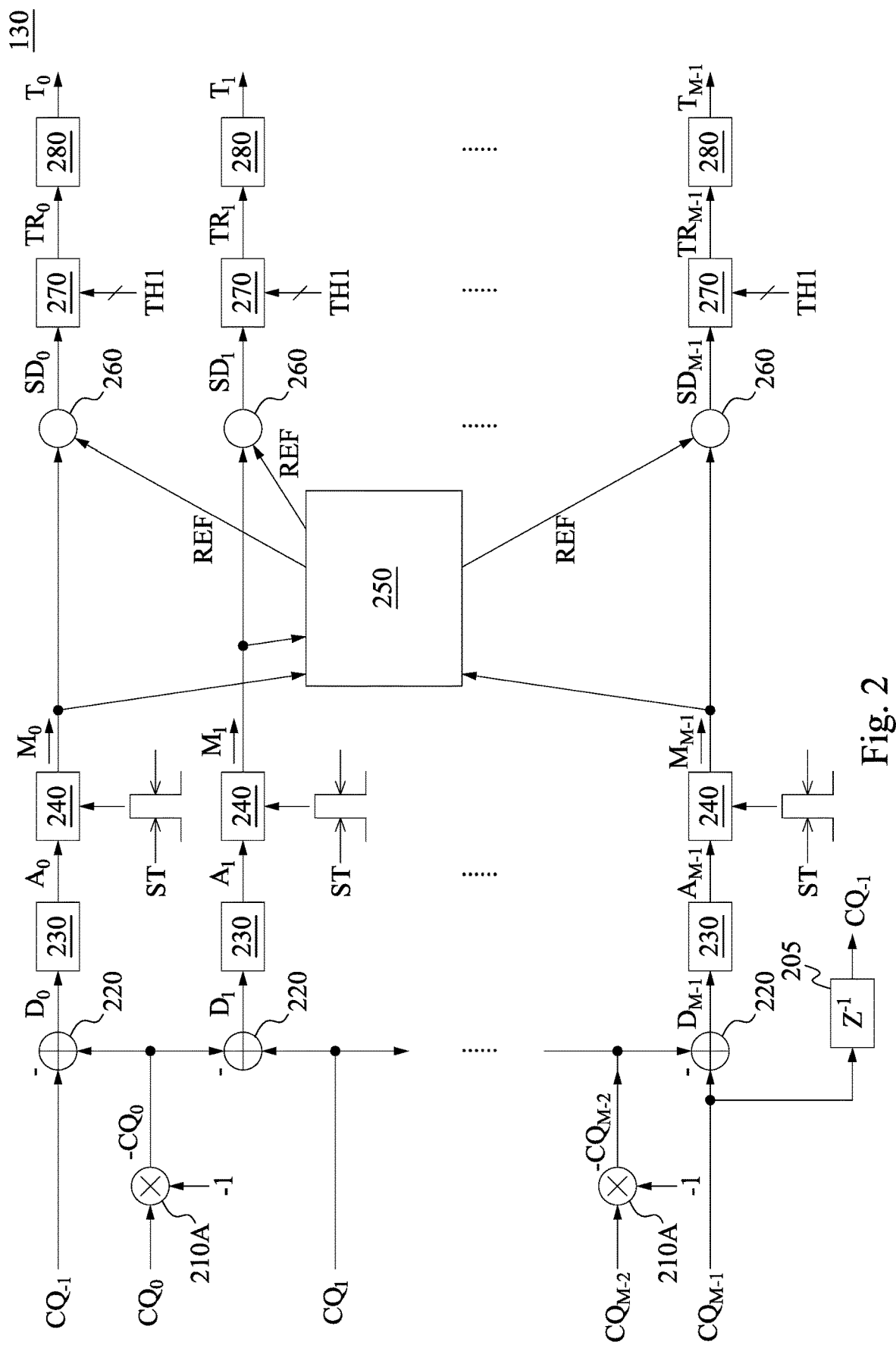
FIG. 2 is a schematic diagram illustrating a skew adjusting circuit, in accordance with some embodiments of the present disclosure.

Reference is now made to FIG. 2. FIG. 2 is a schematic diagram illustrating a skew adjusting circuit, in accordance with some embodiments of the present disclosure. For ease of understanding, similar components in FIG. 2 will be designated with the same label number referred to FIG. 1A. In some embodiments, the skew adjusting circuit 130 includes a delay circuit 205, a number of multiplication circuits 210A, a number of computation circuits 220, a number of absolute value circuits 230, a number of maximum value circuits 240, an average circuit 250, and a number of comparison circuits 260.

The delay circuit 205 is configured to delay the quantized output $CQ_{M-1}$ in the FIG. 1A, to generate the delayed quantized outputs $CQ_{-1}$. In some embodiments, the delay time of the delay circuit 205 is equivalent to the period M×TS in FIG. 1B. The delay circuit 205 can be implemented by various digital circuits, such as a buffer, an inverter, a filter, etc. Embodiments of the delay circuit 205 mentioned above are only examples, and the present disclosure is not limited thereto.

As shown in FIG. 2, the multiplication circuits 210A are electrically coupled to the calibration circuit 120 shown in FIG. 1A. The multiplication circuits 210A are configured to multiply the even quantized outputs $CQ_0, CQ_2, \ldots, CQ_{M-2}$ of the quantized outputs $CQ_0 \sim CQ_{M-1}$ by a ratio value to generate the quantized outputs $-CQ_0, -CQ_2, \ldots, -CQ_{M-2}$. The first multiplication circuit 210A is taken for example. The first multiplication circuit 210A receives the delay quantized output $CQ_0$, and multiplies the quantized output $CQ_0$ by a ratio value to generate the quantized outputs $-CQ_0$. In this embodiment, the ratio value can be implemented as $-1$. Configurations and operations of other multiplication circuits 210A are similar to the first multiplication circuit 210A, which will not be described repeatedly herein.

Following the previous description, in some embodiments, multiplication circuit 210A can be implemented by a frequency mixer or other processing circuits with the same function. Various circuits which can implement the multiplication circuits 210A are within the scope of the present disclosure.

Following the previous description, the computation circuits 220 are electrically coupled to the multiplication circuit 210A and the calibration circuit 120 in FIG. 1A. The computation circuits 220 sequentially receive the delay quantized output $CQ_{-1}$, the quantized outputs $-CQ_0$, $-CQ_2, \ldots, -CQ_{M-2}$ and the odd quantized outputs $CQ_1$, $CQ_3, \ldots, CQ_{M-1}$, and then generate the differential signals $D_0 \sim D_{M-1}$ according to the delay quantized output $CQ_{-1}$, the quantized outputs $-CQ_0, -CQ_2, \ldots, -CQ_{M-2}$ and the odd quantized outputs $CQ_1, CQ_3, \ldots, CQ_{M-1}$.

Following the previous description, the first computation circuit 220 is taken for example. The first computation circuit 220 receives the delay quantized output $CQ_{-1}$ and the quantized output $-CQ_0$ calculated by multiplication circuit 210A, and subtracts the quantized output $-CQ_0$ by the delay quantized output $CQ_{-1}$ to generate the differential signal $D_0$.

Similarly, the second computation circuit 220 receives the quantized output $-CQ_0$ calculated by the multiplication circuit 210A and the quantized output $CQ_1$, and subtracts the quantized output $CQ_1$ by the quantized output $-CQ_0$ to generate the differential signal $D_1$. In other words, the differential signal $D_1$ is actually the sum of quantized output $CQ_1$ and the quantized output $CQ_0$. Configurations and operations of other computation circuits 220 are similar to the first computation circuit 220, which will not be described repeatedly herein. In some embodiments, the computation circuits 220 can be implemented by subtractor or other processing circuits with the same function. Various circuits which can implement the computation circuits 220 are within the scope of the present disclosure.

The absolute value circuits 230 are electrically coupled to the computation circuits 220, to receive the differential signals $D_0 \sim D_{M-1}$ respectively. Each of the absolute value circuits 230 performs an absolute value computation according to the corresponding one of the differential signals $D_0 \sim D_{M-1}$, to generate a corresponding one of the absolute value signals $A_0 \sim A_{M-1}$. For example, the first absolute value circuit 230 receives the differential signal $D_0$, and performs an absolute value computation to receive the absolute value of the differential signal $D_0$, to generate the absolute value signals $A_0$. Configurations of other absolute value circuits 230 are similar to the first absolute value circuit 230, which will not be described repeatedly herein. In some embodiments, the absolute value circuits 230 can be implemented by a processing circuit or a rectifier circuit, and various circuits which can implement the absolute value circuits 230 are within the scope of the present disclosure.

The maximum value circuits 240 are electrically coupled to the absolute value circuits 230, to receive the absolute value signals $A_0 \sim A_{M-1}$ respectively. Each of the maximum value circuits 240 is configured to constantly receive one of the corresponding absolute value signal of the absolute value signals $A_0 \sim A_{M-1}$ in a predetermined interval ST, and perform a maximum value computation to output a corresponding one of the maximum value signals $M_0 \sim M_{M-1}$. The corresponding one of the maximum value signals $M_0 \sim M_{M-1}$ is generated from a maximum value corresponding to the corresponding one of the absolute value signals in the predetermined interval ST. Configurations and operations of other maximum value circuits 240 are similar to the embodiments mentioned above, which will not be described repeatedly herein.

In some embodiments, the maximum value circuit 240 can be implemented by a digital processing circuit, a comparison circuit and/or a register circuit, but the present disclosure is not limited thereto. Various types of circuit for implementing the maximum value circuit 240 are within the scope of the present disclosure.

The average circuit 250 is electrically coupled to the maximum value circuits 240, to receive the maximum value signals $M_0 \sim M_{M-1}$. The average circuit 250 is configured to perform an average computation, according to the maximum value signals $M_0 \sim M_{M-1}$, to average the maximum value signals $M_0 \sim M_{M-1}$ to generate the reference signal REF. In some embodiments, the average circuit 250 can be implemented by a digital processing circuit, but the present disclosure is not limited thereto.

The comparison circuits 260 are coupled to the maximum value circuits 240 and the average circuit 250, to receive the reference signal REF and the maximum value signals $M_0 \sim M_{M-1}$ respectively. Each of the comparison circuits 260 is configured to compare each of the maximum value signals $M_0 \sim M_{M-1}$ with the reference signal REF, to generate the corresponding one of detecting signals $SD_0 \sim SD_{M-1}$. For example, the first comparison circuit 260 compares the maximum value signal $M_0$ with the reference signal REF, to generate the detecting signal $SD_0$. Configurations and operations of other comparison circuits 260 are similar to the first comparison circuit 260, which will not be described repeatedly herein.

In some embodiments, the comparison circuits 260 can be implemented by a comparator. Or, in some embodiments, the comparison circuits 260 can be implemented by a subtractor circuit, and subtracts the reference signal REF by a corresponding one of the maximum value signals $M_0 \sim M_{M-1}$, to generate a corresponding one of the detecting signals $SD_0 \sim SD_{M-1}$. The embodiments of the comparison circuits 260 mentioned above are only examples, and the present disclosure is no limited thereto.

In an embodiment, the detecting signals $SD_0 \sim SD_{M-1}$ can be outputted as the adjusting signals $T_0 \sim T_{M-1}$ in FIG. 1A. It is noted that, the detecting signals $SD_0 \sim SD_{M-1}$ are related to the time information of clock skew of the ADC circuit 110, which can be reflected to the clock skew generated from the ADC device 100.

Figure 5:
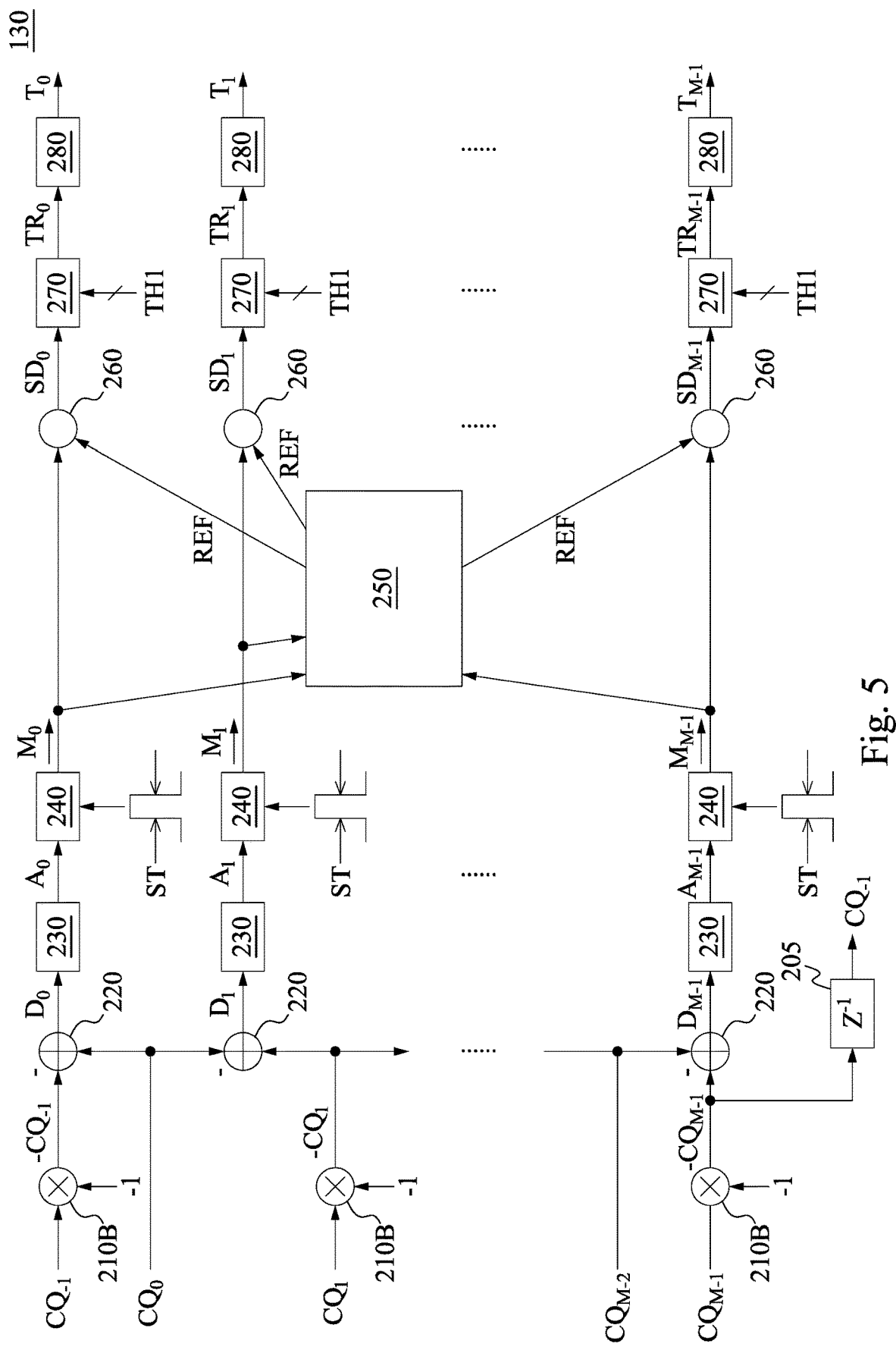
FIG. 5 is a schematic diagram illustrating the skew adjusting circuit in FIG. 1A, in accordance with some embodiments of the present disclosure.

Following the previous description, the operation of the first computation circuits 220 is taken for example, as shown in FIG. 5, because that the adjusting signals $T_0$ is generated based on the difference value between the quantized output $CQ_0$ and the delay quantized outputs $-CQ_{-1}$, the adjusting signals $T_0$ can be configured to indicate the time difference between time $T_0$ (i.e., the sampling time point corresponding to the quantized output $CQ_0$) and time $T_{-1}$ (i.e., the sampling time point corresponding to the delay quantized output −CQ$_{-1}$). The differential signal D$_0$ can be derived as the following equation (1) in time domain:

$$CQ_0 - (-CQ_{-1}) = \sin(2\pi f(n+1)(T+\Delta t)) + \sin(2\pi fnT) \quad (1)$$
$$\approx 2\sin(2\pi fnT + 2\pi f(T+\Delta T)) \cdot \cos(\pi fT + \pi f\Delta t)$$

In which (n+1)(T+ΔT) is equivalent to the sampling time point corresponding to the quantized output CQ$_0$, k is configured to indicate the sampling time point corresponding to each of the quantized outputs CQ$_0$ or −CQ$_{-1}$, f is the frequency of the input signal SIN, Δt is the time difference, and T is the aforementioned period TS.

When the frequency of the input signal SIN is close to the Nyquist frequency (1/2T), the equation (1) can be further derived as the following equation (2):

$$\sin(2\pi f(n+1)(T+\Delta t)) + \sin(2\pi fnT) \approx \quad (2)$$
$$2\sin(2\pi fnT + 2\pi f(T+\Delta t)) \cdot \cos(\pi/2 + \pi f\Delta t)$$

As shown in equation (2), under the condition that the frequency f is close to 1/2T, the time difference Δt is related to the amplitude of the differential signal D$_0$ (i.e., π/2+πfΔt). Therefore, by operations of the absolute value circuits 230 and the maximum value circuit 240, information of the time difference Δt can be reflected by the maximum value signal M$_0$.

Figure 3A:
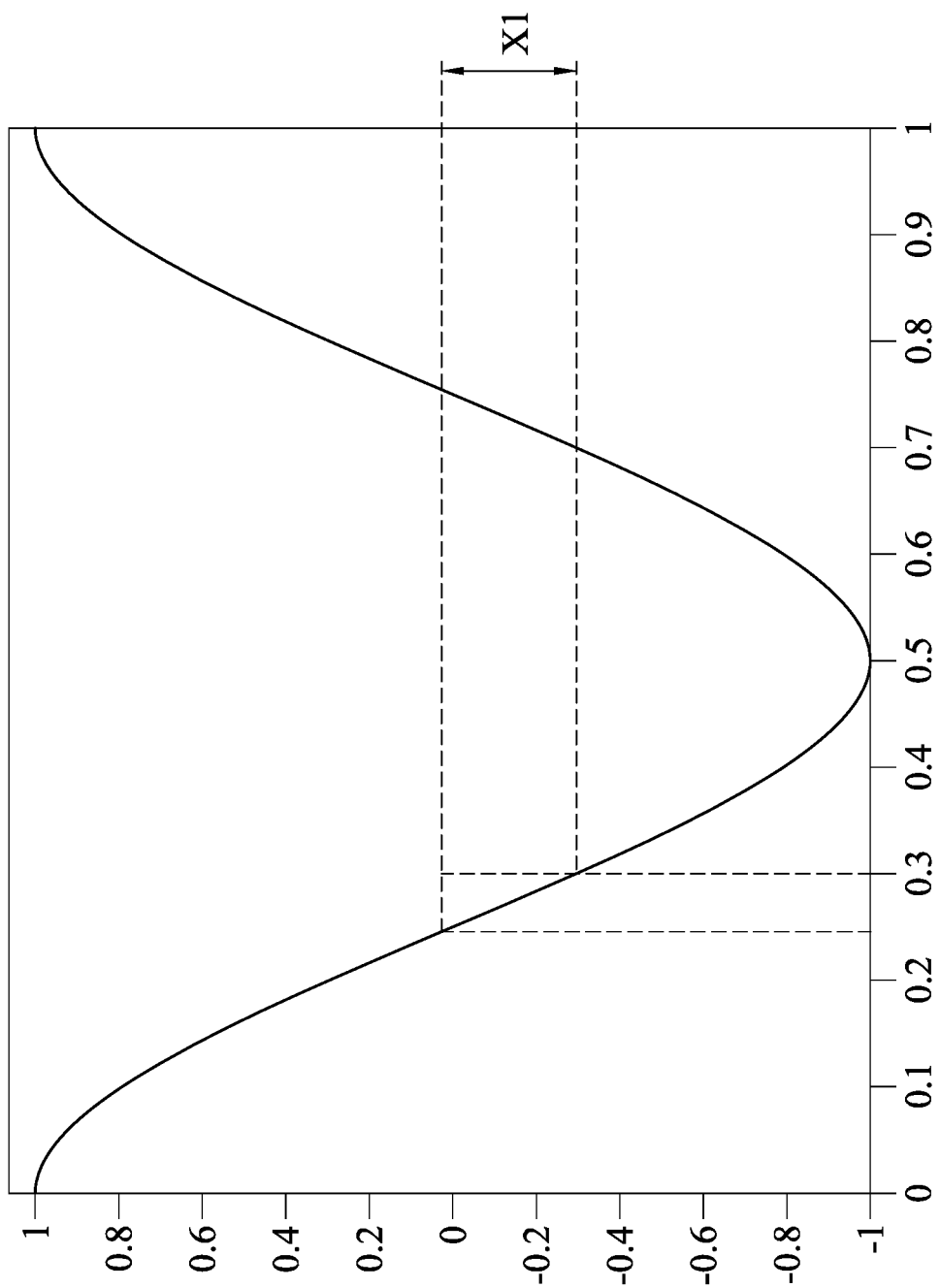
FIG. 3A is a waveform of the differential signal, in accordance with some embodiments of the present disclosure.

Reference is now further made to FIG. 3A. FIG. 3A is a waveform of the differential signal, in accordance with some embodiments of the present disclosure. As shown in FIG. 3A, the vertical axis represents the amplitude of the differential signal, and the horizontal axis represents the time (normalized within 0-1). Following the aforementioned embodiment, the differential signal D$_0$ is expressed in the form of a cosine function, and the variation of the time difference Δt is range X1 when the frequency f is close to the Nyquist frequency (approximately between 0.250.3 on the horizontal axis).

However, under the condition in the prior arts without multiplication circuits 210A, the differential signal D$_0$ between the quantized output CQ$_{-1}$ and the quantized output CQ$_0$ in tine domain can be derived as the following equation (3):

$$CQ_0 - CQ_{-1} = \sin(2\pi f(n+1)(T+\Delta t)) - \sin(2\pi fnT) \quad (3)$$
$$\approx 2\cos(2\pi fnT + \pi f(T+\Delta T)) \cdot \sin(\pi fT + \pi f\Delta t)$$

When the frequency of the input signal SIN is close to the Nyquist frequency (1/2T), the equation (3) can be further derived as the following equation (4):

$$\sin(2\pi f(n+1)(T+\Delta t))-\sin(2\pi fnT)\approx 2\cos(2\pi fnT+\pi f(T+\Delta t))\cdot\sin(\pi/2+\pi f\Delta t) \quad (4)$$

Therefore, known from equation (4), under the condition that the frequency f is close to 1/2T, the time difference Δt is related to the amplitude of the differential signal D$_0$ (i.e., π/2+πfΔt), and the differential signal D$_0$ is expressed in the form of sine function.

Figure 3B:
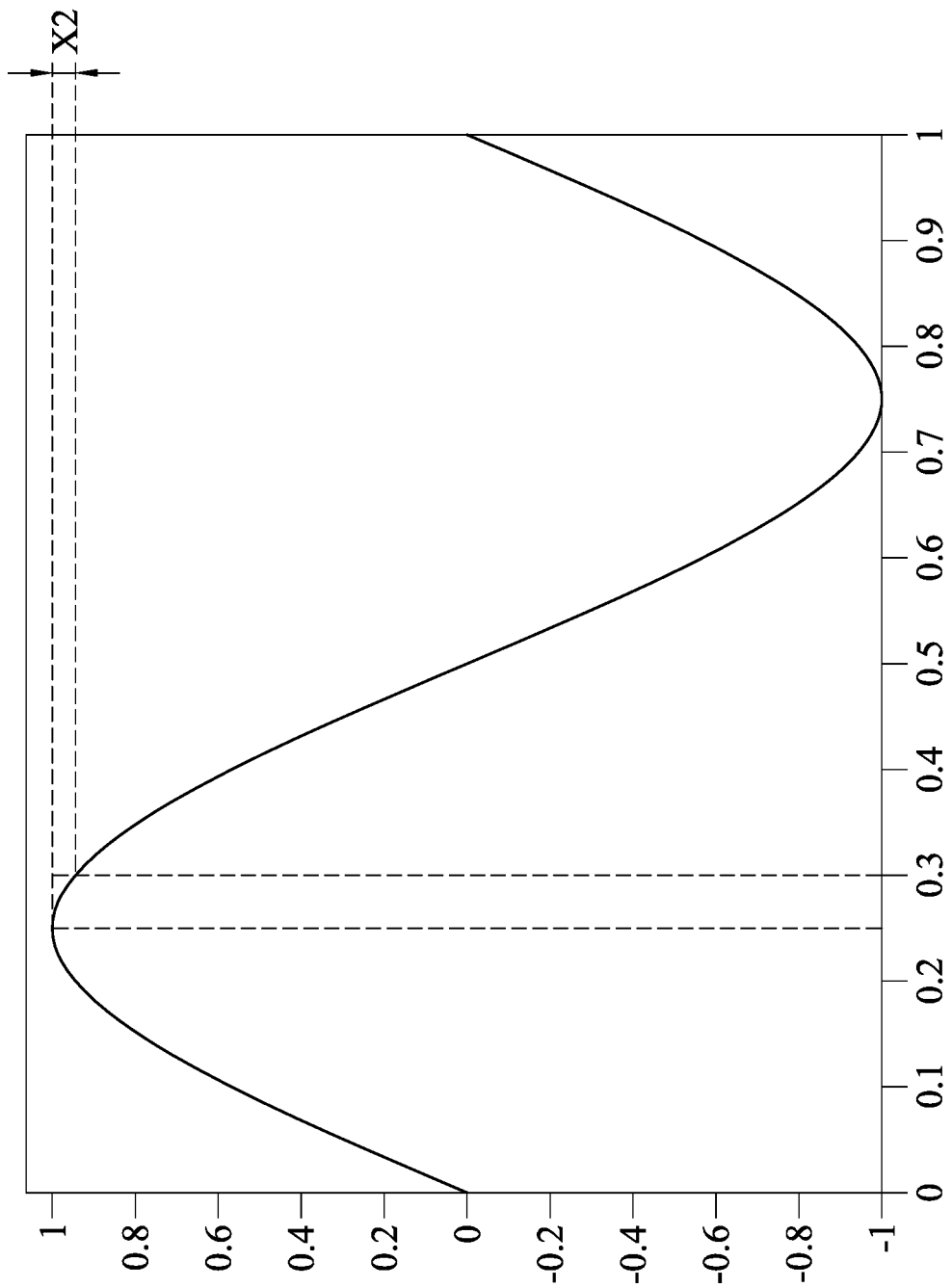
FIG. 3B is a waveform of the differential signal, in accordance with some embodiments of the present disclosure.

Reference is now further made to FIG. 3B. FIG. 3B is a waveform of the differential signal, in accordance with some embodiments of the present disclosure. As shown in FIG. 3B, the vertical axis represents the amplitude of the differential signal, and the horizontal axis represents the time (normalized within 0~1). Following the aforementioned embodiment, the variation of the time difference Δt is range X2 when the frequency f is close to the Nyquist frequency (approximately between 0.25~0.3 on the horizontal axis). As shown in FIG. 3A and FIG. 3B, range X1 is wider than range X2. In other words, the time difference Δt is more obvious when expressed in the form of cosine function than expressed in the form of cosine function, when it is close to the Nyquist frequency. Accordingly, by expressing the differential signal D$_0$ in the form of cosine function, the information disturbance of the time difference Δt can be more obvious, which makes the clock skew calibration more accurate.

Accordingly, by comparing the maximum value signal M$_0$ and the reference signal REF1, the influence of the time difference Δt caused by the clock skew can be obtained. For example, if the maximum value signal M$_0$ is higher than the reference signal REF, it means that the influence of the time difference Δt is positive. Under this condition, the clock skew cause an incorrect leading phase of the clock signal CLK$_0$. Or, if the maximum value signal M$_0$ is lower than the reference signal REF, it means that the influence of the time difference Δt is negative. Under this condition, clock skew cause an incorrect lagging phase of the clock signal CLK$_0$. Therefore, according to different comparing results, the detecting signal SD$_0$ have different logic values, to reflect the phase information of the first ADC circuit 110, which should be adjusted due to the clock skew. Similarly, the aforementioned operations can be adapted to each of the adjusting signals T$_0$~T$_{M-1}$ and the detecting signals SD$_0$~SD$_{M-1}$, which will not be described repeatedly herein.

In some related technologies, they all aim to obtain information of clock skew when the signal frequency is lower than the Nyquist frequency. However, when the input frequency is close to the Nyquist frequency, information of the clock skew is hard to be reflected by the previous skew adjusting circuits. Accordingly, comparing to the aforementioned technology, the embodiments of the ADC device in the present disclosure can still be able to perform calibration, when the signal frequency inputted is close to the Nyquist frequency, by receiving the clock skew information by simple computation, to achieve lower power consumption and less calibration period. It is noted that, when the signal frequency is between 1/3T and 2/3T, it means that the signal frequency is close to the Nyquist frequency.

In some further embodiments, the skew adjusting circuit 130 can include a number of filter circuits 270 and a number of integral circuits 280. The filter circuits 270 are coupled to the comparison circuits 260 respectively, to receive the detecting signals SD$_0$~SD$_M$, respectively.

The filter circuits 270 generate a number of trigger signal TR$_0$~TR$_{M-1}$ according to the detecting signals SD$_0$~SD$_{M-1}$ and at least one threshold value TH1. The integral circuits 280 are coupled to the filter circuits 270 respectively, to receive the trigger signals TR$_0$~TR$_{M-1}$ respectively. The integral circuits 280 generate the adjusting signals T$_0$~T$_{M-1}$ according to the trigger signals TR$_0$~TR$_{M-1}$.

Following the previous description, the first filter circuit 270 and the first integral circuit 280 are taken for example. The first filter circuit 270 is electrically coupled to the first comparison circuit 260, to receive the detecting signal SD$_0$. In some embodiments, the first filter circuit 270 can continuously accumulate the detecting signal SD$_0$, and compare the accumulated detecting signal SD$_0$ and the at least one threshold value TH1, to output one or more trigger signal TR$_0$. For example, when the accumulated detecting signals SD$_0$ is higher than the at least one threshold value TH1, the first filter circuit 270 outputs the accumulated adjusted detecting signals TSD$_0$ as the trigger signal TR0. The first integral circuit 280 is coupled to the first filter circuit 270, to receive the trigger signal TR$_0$. The integral circuits 280 are configured to accumulate the trigger signal TR$_0$, and output the accumulated trigger signal TR$_0$ as the adjusting signal T$_0$, to cooperate with different timing control methods. Configurations and operations of other filter circuits 270 and other integral circuits 280 are similar to the first filter circuit and the first integral circuit, which will not be described repeatedly herein.

By configuring the filter circuits 270, execution times of calibration can be reduced, to reduce dynamic power consumption of the ADC device 100. Meanwhile, jitter caused by the clock skew calibration can also be reduced by configuring the filter circuits 270. By configuring the integral circuits 280, the method can be adjusted by a corresponding value cooperated with the timing. In real applications, the filter circuits 270 and the integral circuits 280 can be selectively configured according to actual requirement. In addition, the aforementioned threshold value TH1 can also be adjusted according to actual requirement.

In different embodiments, the aforementioned filter circuits 270 and the integral circuits 280 can be implemented by at least one comparator (e.g., the one configured to compare the trigger signal and the threshold value TH1 or compare the accumulated trigger signal), at least one register (e.g., the one configured to store the aforementioned accumulated signals or the accumulated trigger signals, etc.), at least one removing circuit (e.g., the one configured to remove data in the register mentioned above) and/or at least one computation circuit (e.g., the one configured to generate accumulated signals or configured to accumulate the trigger signals). Configurations of the filter circuits 270 and the integral circuits 280 mentioned above are only examples, and the present disclosure is not limited thereto.

Figure 4:
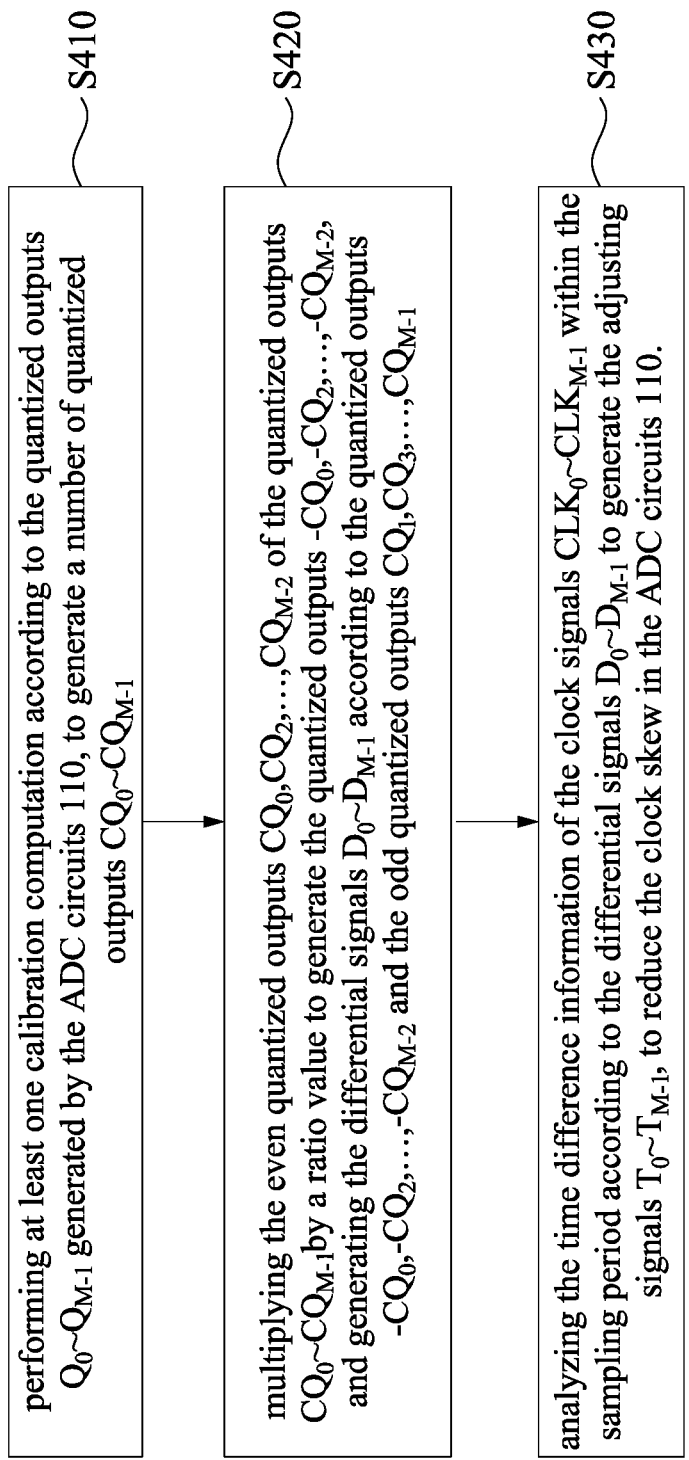
FIG. 4 is a flowchart illustrating a clock skew calibration method, in accordance with some embodiments of the present disclosure.

Reference is now made to FIG. 4. FIG. 4 is a flowchart illustrating a clock skew calibration method 400, in accordance with some embodiments of the present disclosure. For ease of understanding, the clock skew calibration method 400 will be described with the references of aforementioned figures. In an embodiments, the clock skew calibration method 400 firstly operates a step S410, performing at least one calibration computation according to the quantized outputs Q$_0$~Q$_{M-1}$ generated by the ADC circuits 110, to generate a number of quantized outputs CQ$_0$~CQ$_{M-1}$.

Then, the clock skew calibration method 400 operates step S420, multiplying the even quantized outputs CQ$_0$, CQ$_2$, ..., CQ$_{M-2}$ of the quantized outputs CQ$_0$~CQ$_{M-1}$ by a ratio value to generate the quantized outputs –CQ$_0$, –CQ$_2$, ..., –CQ$_{M-2}$, and generating the differential signals D$_0$~D$_{M-1}$ according to the quantized outputs –CQ$_0$, –CQ$_2$, ..., –CQ$_{M-2}$ and the odd quantized outputs CQ$_1$, CQ$_3$, ..., CQ$_{M-1}$.

Following the previous description, in step S430, analyzing the time difference information of the clock signals CLK$_0$~CLK$_{M-1}$ within the sampling period according to the differential signals D$_0$~D$_{M-1}$ to generate the adjusting signals T$_0$~T$_{M-1}$, to reduce the clock skew in the ADC circuits 110. The description and embodiments of each of the operations mentioned above can be referred to the embodiments described above, which will not be described repeatedly herein.

In another embodiment, FIG. 5 is a schematic diagram illustrating a skew adjusting circuit 130 in FIG. 1A, in accordance with some embodiments of the present disclosure. In some embodiments, the skew adjusting circuit 130 includes the delay circuit 205, a number of multiplication circuits 210B, a number of computation circuits 220, a number of absolute value circuits 230, a number of maximum value circuits 240, an average circuit 250, and a number of comparison circuits 260. The skew adjusting circuit 130 shown in FIG. 5 is similar to the skew adjusting circuit 130 shown in FIG. 2, and the difference between two circuits of the above is the implementation of the multiplication circuits 210A and the multiplication circuits 210B.

Following the previous description, as shown in FIG. 5, the multiplication circuits 210B are electrically coupled to the calibration circuit 120 shown in FIG. 1A. The multiplication circuits 210B are configured to multiply the delay quantized output CQ$_{-1}$ and the odd quantized outputs CQ$_1$, CQ$_3$, ..., CQ$_{M-1}$ of the quantized outputs CQ$_0$~CQ$_{M-1}$ by a ratio value to generate the quantized outputs –CQ$_{-1}$, –CQ$_3$, ..., –CQ$_{M-1}$. The first multiplication circuit 210B is taken for example. The first multiplication circuit 210B receives the delay quantized output CQ$_{-1}$, and multiplies the quantized output CQ$_{-1}$ by a ratio value to generate the quantized outputs –CQ$_{-1}$. In this embodiment, the ratio value can be implemented as –1. Configurations and operations of other multiplication circuits 210B are similar to the first multiplication circuit 210B, which will not be described repeatedly herein.

Following the previous description, in some embodiments, the multiplication circuits 210B can be implemented by a frequency mixer or other processing circuits with the same function. Various circuits which can implement the multiplication circuits 210B are within the scope of the present disclosure.

Following the previous description, the computation circuits 220 are electrically coupled to the multiplication circuits 210B and the calibration circuit 120 in FIG. 1A. The computation circuits 220 sequentially receive the delay quantized output CQ$_{-1}$, the quantized outputs –CQ$_{-1}$, –CQ$_3$, ..., –CQ$_{M-1}$ and the even quantized outputs CQ$_0$, CQ$_2$, ..., CQ$_{M-2}$, and then generate the differential signals D$_0$~D$_{M-1}$ according to the delay quantized output CQ$_{-1}$, the quantized outputs –CQ$_{-1}$, –CQ$_1$, –CQ$_3$, ..., –CQ$_{M-1}$ and the even quantized outputs CQ$_0$, CQ$_2$, ..., CQ$_{M-2}$.

Following the previous description, the first computation circuit 220 is taken for example. The first computation circuit 220 receives the quantized output –CQ$_{-1}$ calculated by the multiplication circuit 210B and the quantized output CQ$_0$, and subtracts the quantized output CQ$_0$ by the quantized output –CQ$_{-1}$ to generate the differential signal D$_0$. In other words, the differential signal D is actually the sum of quantized output CQ$_0$ and the quantized output CQ$_{-1}$.

Similarly, the second computation circuit 220 receives the quantized output –CQ$_1$ calculated by the multiplication circuit 210B and the quantized output CQ$_0$, and subtracts the quantized output –CQ$_1$ by the quantized output CQ$_0$ to generate the differential signal D$_1$. Configurations and operations of other computation circuits 220 are similar to the first computation circuit 220, which will not be described repeatedly herein. In some embodiments, the computation circuits 220 can be implemented by subtractor or other processing circuits with the same function. Various circuits which can implement the computation circuits 220 are within the scope of the present disclosure.

It is noted that, implementations of the delay circuit 205, the absolute value circuits 230, the maximum value circuits 240, the average circuit 250, the comparison circuits 260, the filter circuits 270, and the integral circuits 280 shown in FIG.

5 are the same as those described in FIG. 2, which will not be described repeatedly herein.

Figure 6:
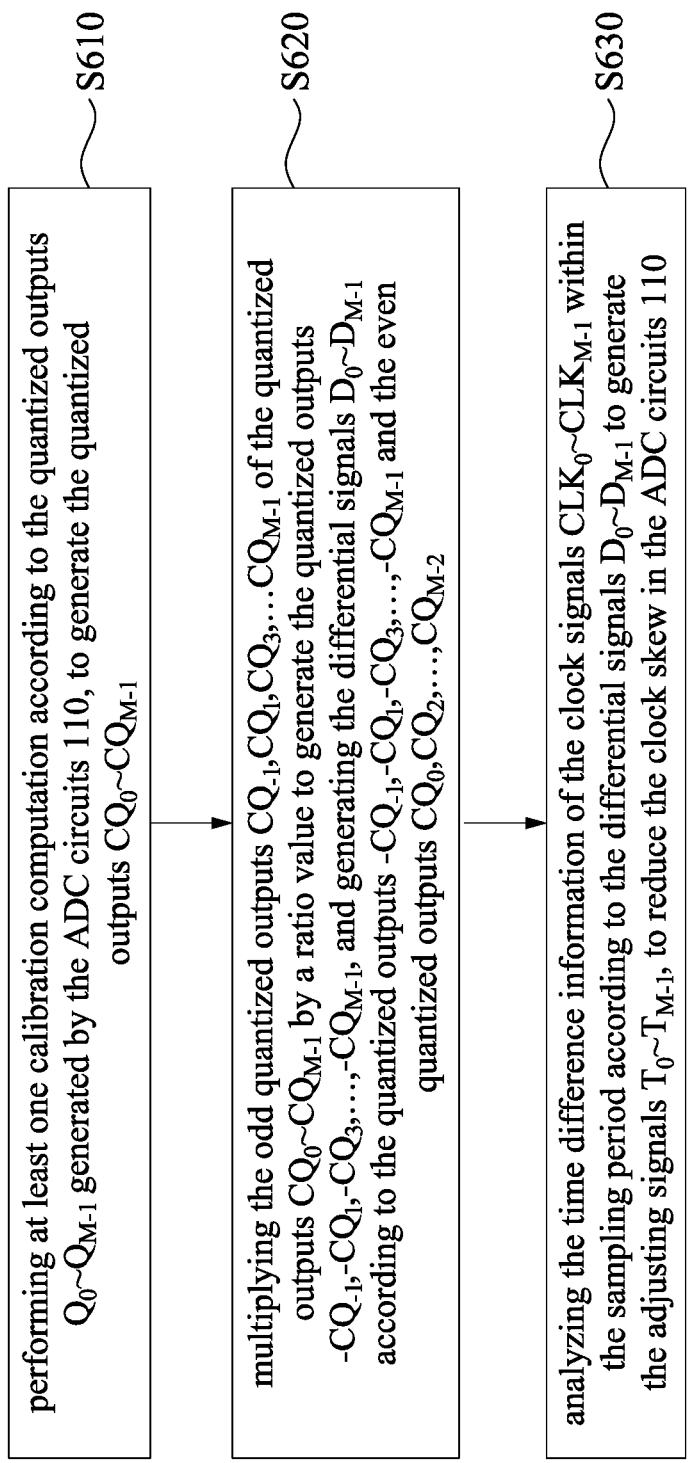
FIG. 6 is a flowchart illustrating a clock skew calibration method, in accordance with some embodiments of the present disclosure.

Reference is now made to FIG. 6. FIG. 6 is a flowchart illustrating a clock skew calibration method 600, in accordance with some embodiments of the present disclosure. For ease of understanding, the clock skew calibration method 600 will be described with the references of aforementioned figures. In an embodiment, the clock skew calibration method 600 firstly perform step S610, performing at least one calibration computation according to the quantized outputs $Q_0 \sim Q_{1\setminus 4-1}$ generated by the ADC circuits 110, to generate the quantized outputs $CQ_0 \sim CQ_{M-1}$.

Then, the clock skew calibration method 600 operates step S620, multiplying the odd quantized outputs $CQ_{-1}$, $CQ_1$, $CQ_3$, $CQ_{M-1}$ of the quantized outputs $CQ_0 \sim CQ_{M-1}$ by a ratio value to generate the quantized outputs $-CQ_{-1}$, $-CQ_1$, $-CQ_3$, and generating the differential signals $D_0 \sim D_{M-1}$ according to the quantized outputs $-CQ_{-1}$, $-CQ_1$, $-CQ_3$, ..., $-CQ_{M-1}$ and the even quantized outputs $CQ_0$, $CQ_2$, ..., $CQ_{M-2}$.

Following the previous description, in step S630, analyzing the time difference information of the clock signals $CLK_0 \sim CLK_{M-1}$ within the sampling period according to the differential signals $D_0 \sim D_{M-1}$ to generate the adjusting signals $T_0 \sim T_{M-1}$, to reduce the clock skew in the ADC circuits 110. The description and embodiments of each of the operations mentioned above can be referred to the embodiments described above, which will not be described repeatedly herein.

In sum, the ADC device and the clock skew calibration method in the present disclosure are mainly aim to generate the frequency-mixed quantized outputs by mixing a part the quantized output by a frequency mixing circuit, and calculate the differential signals. Therefore, the information of the clock skew can be obtained by simple computation, and be calibrated by the ADC device. In this way, the power consumption and the calibration period can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog to digital converter (ADC) device comprising:
    a plurality of ADC circuits configured to convert an input signal, according to a plurality of interleaved clock signals, to generate a plurality of first quantized outputs;
    a calibration circuit configured to perform at least one calibration computation, according to the plurality of first quantized outputs, to generate a plurality of second quantized outputs; and
    a skew adjusting circuit configured to multiply a plurality of even quantized outputs of the plurality of second quantized outputs by a ratio value to generate a plurality of third quantized outputs, and generate a plurality of differential signals according to the plurality of third quantized outputs and a plurality of odd quantized outputs of the plurality of second quantized outputs, and analyze a time difference information of the plurality of interleaved clock signals within a sampling period, according to the plurality of differential signals, to generate a plurality of adjusting signals, wherein the plurality of adjusting signals are configured to reduce a clock skew in the plurality of ADC circuits.

2. The analog to digital converter device of claim 1, wherein the skew adjusting circuit is further configured to perform a plurality of absolute value computations on the plurality of differential signals respectively to generate a plurality of absolute value signals, and perform a plurality of maximum value computations on the plurality of absolute value signals to generate a plurality of maximum value signals, and average the plurality of maximum value signals to generate a reference signal, and compare the reference signal with the plurality of maximum value signals to generate the plurality of adjusting signals.

3. The analog to digital converter device of claim 2, wherein the skew adjusting circuit comprising:
    a delay circuit configured to delay a last one of the plurality of second quantized outputs, to generate a delay quantized output;
    a plurality of multiplication circuits configured to multiply the plurality of even quantized outputs of the plurality of second quantized outputs by the ratio value to generate the plurality of third quantized outputs;
    a plurality of computing circuits configured to receive the delay quantized output, the plurality of third quantized outputs and the plurality of odd quantized outputs of the plurality of second quantized outputs, sequentially, and configured to generate the plurality of differential signals according to the delay quantized output, the plurality of third quantized outputs and two of the plurality of odd quantized outputs;
    a plurality of absolute value circuits, wherein each of the plurality of absolute value circuits is configured to perform an absolute value computation according to a corresponding differential signal of the plurality of differential signals, to generate a corresponding absolute value signal of the plurality of absolute value signals;
    a plurality of maximum value circuits, wherein each of the plurality of maximum value circuits is configured to receive the corresponding absolute value signal and perform a maximum value computation to output a corresponding maximum value signal of the plurality of maximum value signals, wherein the corresponding maximum value signal is generated from a maximum value of the corresponding absolute value signal in a predetermined interval;
    an average circuit configured to perform an average computation, to average the plurality of maximum value signals to generate the reference signal; and
    a plurality of comparison circuit configured to compare the reference signal with each of the plurality of maximum value signals to generate a plurality of detecting signals.

4. The analog to digital converter device of claim 3, wherein the skew adjusting circuit output the plurality of detecting signals as the plurality of adjusting signals.

5. The analog to digital converter device of claim 3, wherein the plurality of multiplication circuits are electrically coupled to the plurality of even computing circuits of the plurality of computing circuits respectively, and each of the plurality of multiplication circuits is configured transmit a corresponding third quantized output of the plurality of third quantized outputs to a corresponding one of the plurality of even computing circuits.

6. An analog to digital converter device, comprising:
a plurality of ADC circuits configured to convert an input signal, according to a plurality of interleaved clock signals, to generate a plurality of first quantized outputs;
a calibration circuit configured to perform at least one calibration computation, according to the plurality of first quantized outputs, to generate a plurality of second quantized outputs; and
a skew adjusting circuit configured to multiply a plurality of odd quantized outputs of the plurality of second quantized outputs by a ratio value to generate a plurality of third quantized outputs, and generate a plurality of differential signals according to the plurality of third quantized outputs and a plurality of even quantized outputs of the plurality of second quantized outputs, and analyze a time difference information of the plurality of interleaved clock signals within a sampling period, according to the differential signal, to generate a plurality of adjusting signals, wherein the plurality of adjusting signals are configured to reduce a clock skew in the plurality of ADC circuits.

7. The analog to digital converter device of claim 6, wherein the skew adjusting circuit is further configured to perform a plurality of absolute value computations on the plurality of differential signals respectively to generate a plurality of absolute value signals, and perform a plurality of maximum value computations on the plurality of absolute value signals to generate a plurality of maximum value signals, and average the plurality of maximum value signals to generate a reference signal, and compare the reference signal with the plurality of maximum value signals to generate the plurality of adjusting signals, respectively.

8. The analog to digital converter device of claim 7, wherein the skew adjusting circuit comprising:
a delay circuit configured to delay a last one of the plurality of second quantized outputs, to generate a delay quantized output;
a plurality of multiplication circuits configured to multiply the plurality of odd quantized outputs of the plurality of second quantized outputs by the ratio value to generate the plurality of third quantized outputs;
a plurality of computing circuits configured to receive the delay quantized output, the plurality of third quantized outputs and the plurality of even quantized outputs of the plurality of second quantized outputs, sequentially, and configured to generate the plurality of differential signals according to the delay quantized output, the plurality of third quantized outputs and two of the plurality of even quantized outputs;
a plurality of absolute value circuits, wherein each of the plurality of absolute value circuits is configured to perform an absolute value computation according to a corresponding differential signal of the plurality of differential signals, to generate a corresponding absolute value signal of the plurality of absolute value signals;
a plurality of maximum value circuits, wherein each of the plurality of maximum value circuits is configured to receive the corresponding absolute value signal and perform a maximum value computation to output a corresponding maximum value signal of the plurality of maximum value signals, wherein the corresponding maximum value signal is generated from a maximum value of the corresponding absolute value signal in a predetermined interval;
an average circuit configured to perform an average computation, to average the plurality of maximum value signals to generate the reference signal; and
a plurality of comparison circuit configured to compare the reference signal with each of the plurality of maximum value signals to generate a plurality of detecting signals.

9. The analog to digital converter device of claim 8, wherein the skew adjusting circuit output the plurality of detecting signals as the plurality of adjusting signals.

10. The analog to digital converter device of claim 8, wherein the plurality of multiplication circuits are electrically coupled to the plurality of odd computing circuits of the plurality of computing circuits respectively, and each of the plurality of multiplication circuits is configured transmit a corresponding third quantized output of the plurality of third quantized outputs to a corresponding one of the plurality of odd computing circuits.

11. A method for calibrating clock skew, comprising:
performing at least one calibrating operation, according to a plurality of first quantized outputs generated by a plurality of analog to digital converter (ADC) circuits, to generate a plurality of second quantized outputs;
multiplying a plurality of even quantized outputs of the plurality of second quantized outputs by a ratio value to generate a plurality of third quantized outputs, and generating a plurality of differential signals according to the plurality of third quantized outputs and a plurality of odd quantized outputs of the plurality of second quantized outputs, by a skew adjusting circuit; and
analyzing a time difference information of the plurality of interleaved clock signals within a sampling period, according to the plurality of differential signals, to generate a plurality of adjusting signals;
wherein the plurality of adjusting signals are configured to reduce a clock skew in the plurality of ADC circuits.

12. The method for calibrating clock skew of claim 11, wherein the operation of generating the plurality of differential signals further comprises:
delaying a last one of the plurality of second quantized outputs, to generate a delay quantized output;
multiplying the plurality of even quantized outputs of the plurality of second quantized outputs by the ratio value, to generate the plurality of third quantized outputs; and
receiving the delay quantized output, the plurality of third quantized outputs and the plurality of odd quantized outputs of the plurality of second quantized outputs, sequentially, and generating the plurality of differential signals according to the delay quantized output, the plurality of third quantized outputs and two of the plurality of odd quantized outputs.

13. The method for calibrating clock skew of claim 11, wherein the operation of generating the plurality of adjusting signals further comprises:
performing an absolute value computation on the plurality of differential signals respectively to generate a plurality of absolute value signals;
performing a maximum value computation on each of the plurality of absolute value signals to generate a plurality of maximum value signals;
averaging the plurality of maximum value signals to generate a reference signal; and comparing the reference signal with the plurality of maximum value signals to generate a plurality of detecting signals.

14. The method for calibrating clock skew of claim 13, wherein the skew adjusting circuit output the plurality of detecting signals as the plurality of adjusting signals.

15. The method for calibrating clock skew of claim 11, wherein the ratio value is set as −1.

16. A method for calibrating clock skew, comprising:
performing at least one calibrating operation, according to a plurality of first quantized outputs generated by a plurality of analog to digital converter (ADC) circuits, to generate a plurality of second quantized outputs;
multiplying a plurality of odd quantized outputs of the plurality of second quantized outputs by a ratio value to generate a plurality of third quantized outputs, and generating a plurality of differential signals according to the plurality of third quantized outputs and a plurality of even quantized outputs of the plurality of second quantized outputs, by a skew adjusting circuit; and
analyzing a time difference information of the plurality of interleaved clock signals within a sampling period, according to the plurality of differential signals, to generate a plurality of adjusting signals;
wherein the plurality of adjusting signals are configured to reduce a clock skew in the plurality of ADC circuits.

17. The method for calibrating clock skew of claim 16, wherein the operation of generating the plurality of differential signals further comprises:
delaying a last one of the plurality of second quantized outputs, to generate a delay quantized output;
multiplying the plurality of odd quantized outputs of the plurality of second quantized outputs by the ratio value, to generate the plurality of third quantized outputs; and
receiving the delay quantized output, the plurality of third quantized outputs and the plurality of even quantized outputs of the plurality of second quantized outputs, sequentially, and generating the plurality of differential signals according to the delay quantized output, the plurality of third quantized outputs and two of the plurality of even quantized outputs.

18. The method for calibrating clock skew of claim 16, wherein the operation of generating the plurality of adjusting signals further comprises:
performing an absolute value computation on the plurality of differential signals respectively to generate a plurality of absolute value signals;
performing a maximum value computation on each of the plurality of absolute value signals to generate a plurality of maximum value signals;
averaging the plurality of maximum value signals to generate a reference signal; and
comparing the reference signal with the plurality of maximum value signals to generate a plurality of detecting signals.

19. The method for calibrating clock skew of claim 18, wherein the skew adjusting circuit output the plurality of detecting signals as the plurality of adjusting signals.

20. The method for calibrating clock skew of claim 16, wherein the ratio value is set as −1.

* * * * *